(12) United States Patent
Yamashita et al.

(10) Patent No.: US 10,350,710 B2
(45) Date of Patent: Jul. 16, 2019

(54) LASER IRRADIATION METHOD AND APPARATUS

(71) Applicant: THE JAPAN STEEL WORKS, LTD., Shinagawa-ku, Tokyo (JP)

(72) Inventors: Yasuhiro Yamashita, Kanagawa (JP); Ryosuke Sato, Kanagawa (JP); Toshio Inami, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 0 days.

(21) Appl. No.: 15/569,062

(22) PCT Filed: Apr. 8, 2015

(86) PCT No.: PCT/JP2015/061038
§ 371 (c)(1),
(2) Date: Oct. 24, 2017

(87) PCT Pub. No.: WO2016/162989
PCT Pub. Date: Oct. 13, 2016

(65) Prior Publication Data
US 2018/0111222 A1    Apr. 26, 2018

(51) Int. Cl.
*B23K 26/00*    (2014.01)
*B23K 26/402*   (2014.01)
(Continued)

(52) U.S. Cl.
CPC .......... *B23K 26/50* (2015.10); *B23K 26/0006* (2013.01); *B23K 26/0622* (2015.10);
(Continued)

(58) Field of Classification Search
CPC ......... H01L 31/03926; H01L 31/02008; H01L 31/0504; H01L 31/18; B23K 26/0057;
(Continued)

(56) References Cited

U.S. PATENT DOCUMENTS

2008/0096368 A1*  4/2008  Sakai ................... H01L 21/268
                                                        438/473
2008/0223831 A1    9/2008  Yoshikawa
                          (Continued)

FOREIGN PATENT DOCUMENTS

CN    101247920 A    8/2008
CN    102986001 A    3/2013
                 (Continued)

OTHER PUBLICATIONS

International Search Report (ISR), Written Opinion, and International Preliminary Report on Patentability (IPRP) dated Jul. 14, 2015 issued in International Application No. PCT/JP2015/061038.
English translation of the International Preliminary Report on Patentability dated Oct. 19, 2017 issued in counterpart International Application No. PCT/JP2015/061038.

*Primary Examiner* — Seahvosh Nikmanesh
(74) *Attorney, Agent, or Firm* — Holtz, Holtz & Volek PC (57) ABSTRACT

A laser irradiation method sets scan lines in an x direction in parallel, and in a y direction to be separate by an inter-scan-line distance Py corresponding to laser irradiation areas of a processing target object, orients a length direction of a linear laser spot with length Wy and width Wx in the y direction, and irradiates target object with the laser spot in each of irradiation positions arranged at width direction intervals Λ while moving the laser spot relative to the target object along the scan lines. The method includes determining the inter-scan-line distance Py, the width direction interval Λ, and a position shift quantity Δx (where, 0<Δx<Λ) so that the irradiation positions on adjacent scan lines are shifted in the x direction by the position shift quantity Δx and a cumulative value of the applied laser intensity is substantially equalized.

3 Claims, 12 Drawing Sheets

(51) Int. Cl.
  *B23K 26/082* (2014.01)
  *B23K 26/073* (2006.01)
  *B23K 26/50* (2014.01)
  *B23K 26/08* (2014.01)
  *B23K 26/0622* (2014.01)
  *B23K 26/53* (2014.01)
  *H01L 51/00* (2006.01)
  *B23K 103/00* (2006.01)
  *B23K 103/16* (2006.01)

(52) U.S. Cl.
  CPC ........ *B23K 26/0732* (2013.01); *B23K 26/082* (2015.10); *B23K 26/0853* (2013.01); *B23K 26/402* (2013.01); *B23K 26/53* (2015.10); *B23K 2103/172* (2018.08); *B23K 2103/42* (2018.08); *B23K 2103/54* (2018.08); *H01L 51/003* (2013.01)

(58) Field of Classification Search
  CPC . B23K 26/0622; B23K 26/53; B23K 26/0006
  See application file for complete search history.

(56) References Cited

U.S. PATENT DOCUMENTS

| | | | |
|---|---|---|---|
| 2008/0245779 A1* | 10/2008 | Nomaru | B23K 26/0736 219/121.75 |
| 2011/0132549 A1 | 6/2011 | Sercel et al. | |
| 2013/0119031 A1 | 5/2013 | Matsuda et al. | |

FOREIGN PATENT DOCUMENTS

| | | | |
|---|---|---|---|
| JP | 2007118078 A | 5/2007 |
| JP | 2010258171 A | 11/2010 |
| JP | 2012024783 A | 2/2012 |
| JP | 2012028740 A | 2/2012 |
| JP | 2012035297 A | 2/2012 |
| JP | 2013239572 A | 11/2013 |
| KR | 100999248 B1 | 12/2010 |
| KR | 1020130036317 A | 4/2013 |
| WO | 2007036797 A1 | 4/2007 |
| WO | 2012011202 A1 | 1/2012 |

* cited by examiner

LASER IRRADIATION METHOD AND APPARATUS

CROSS-REFERENCE TO RELATED APPLICATIONS

The present application is a National Stage Application filed under 35 USC 371 of PCT/JP2015/061038, filed on Apr. 8, 2015, which is incorporated herein by reference in its entirety.

TECHNICAL FIELD

The present invention relates to a laser irradiation method and apparatus, and particularly to a laser irradiation method and apparatus capable of laser irradiation using a linear laser spot with no insufficient intensity portion or excessive intensity portion.

BACKGROUND ART

There is a conventionally known laser lift-off apparatus that irradiates a carrier on which a material layer is laminated with a square laser spot to locally heat the carrier and delaminate the material layer from the carrier. The laser lift-off apparatus uses a square laser spot. The laser spot has a profile having a central portion where the laser intensity is uniform and a peripheral portion where the laser intensity gradually decreases. Adjacent irradiation positions are determined so that the peripheral portions of the laser spots overlap with each other, and the laser spot is applied in the form of pulses in the irradiation positions (see Patent Literature 1, for example).

On the other hand, there is a known laser irradiation apparatus that irradiates a substrate with a linear laser spot. The linear laser spot has, along the major axis of the linear laser spot (the laser spot axis extending in the length direction and passing through the center of the width of the laser spot), a profile having a flat portion where the laser intensity can be considered to be uniform and peripheral portions where the laser intensity gradually decreases and, along the minor axis of the linear laser spot (the laser spot axis extending in the width direction and passing through the center of the length of the laser spot), a profile having a roughly Gaussian distribution (see Patent Literature 2, for example).

CITATION LIST

Patent Literature

[Patent Literature 1]
Japanese Patent Laid-Open No. 2012-28740 (FIG. 2)
[Patent Literature 2]
Japanese Patent Laid-Open No. 2010-258171 (FIG. 3 and FIG. 4)

SUMMARY OF INVENTION

Technical Problem

The laser lift-off apparatus of related art described above uses a square laser spot, and the square laser spot has a large irradiation area. Therefore, to achieve a desired energy density, a high-power, expensive layer irradiation unit is required, undesirably resulting in an increase in cost.

On the other hand, since a linear laser spot has a small irradiation area, even a low-power, inexpensive laser irradiation unit can provide a desired energy density.

However, in the case where adjacent irradiation positions are determined so that the peripheral portions of the laser spots overlap with each other, and the laser spot is applied in the form of pulses in the irradiation positions, as in the laser lift-off apparatus of related art described above, excessive and insufficient irradiation intensities undesirably occur in the major axis direction.

Figure 2:
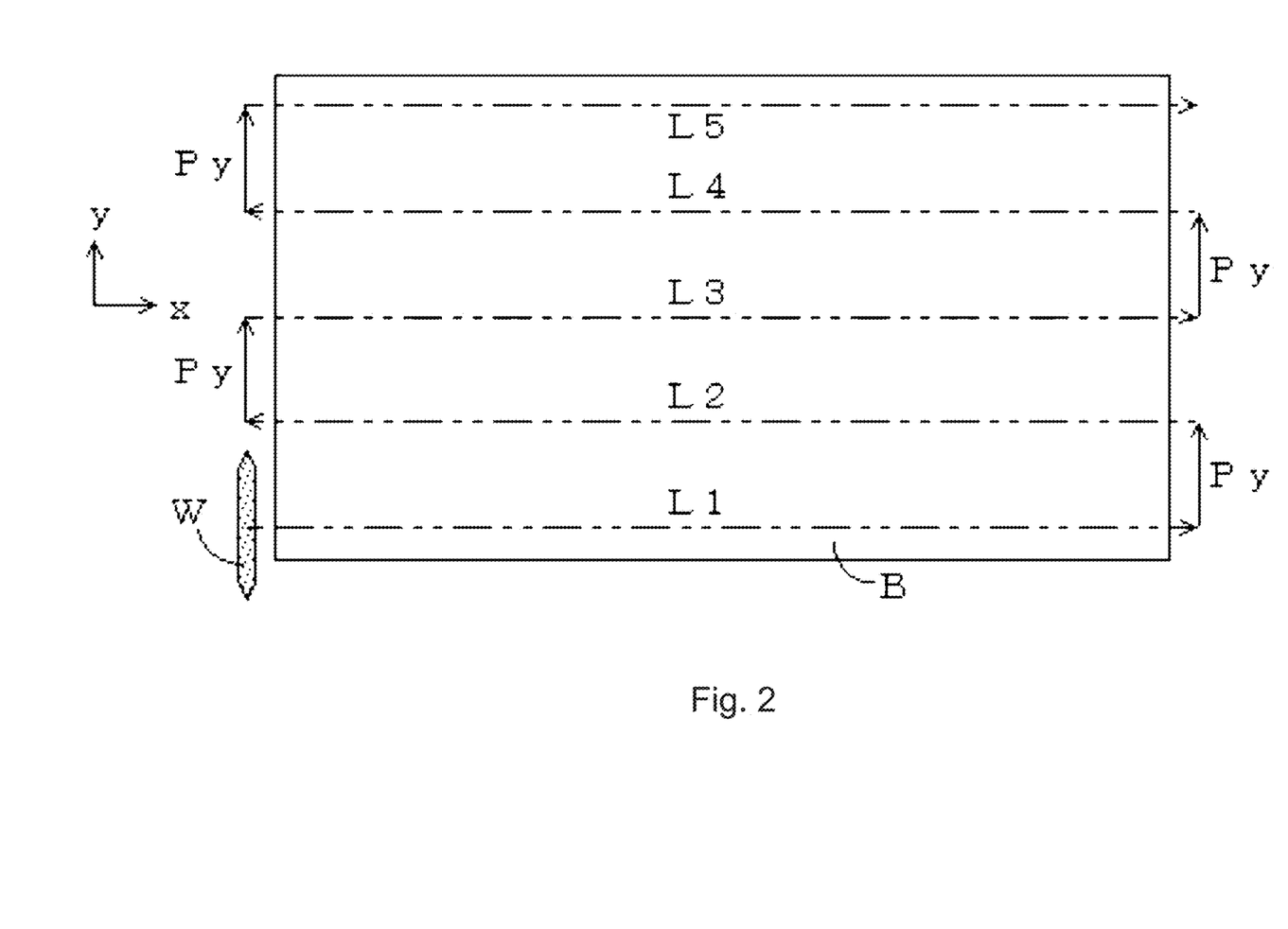
FIG. 2 describes scan lines.

That is, it is assumed that a processing target object B is entirely scanned with a linear laser spot W as follows: the length direction of the linear laser spot W is oriented in the y direction; the laser spot W is moved in the +x direction along a scan line L1 (in practice, the processing target object B is moved in the −x direction); the laser spot W is then moved in the −x direction along a scan line L2, which is separate from the scan line L1 by an inter-scan-line distance Py; the laser spot W is then moved in the +x direction along a scan line L3, which is separate from the scan line L2 by the inter-scan-line distance Py; the laser spot W is then moved in the −x direction along a scan line L4, which is separate from the scan line L3 by the inter-scan-line distance Py; and the laser spot W is then moved in the +x direction along a scan line L5, which is separate from the scan line L4 by the inter-scan-line distance Py, as shown in FIG. 2.

Figure 3:
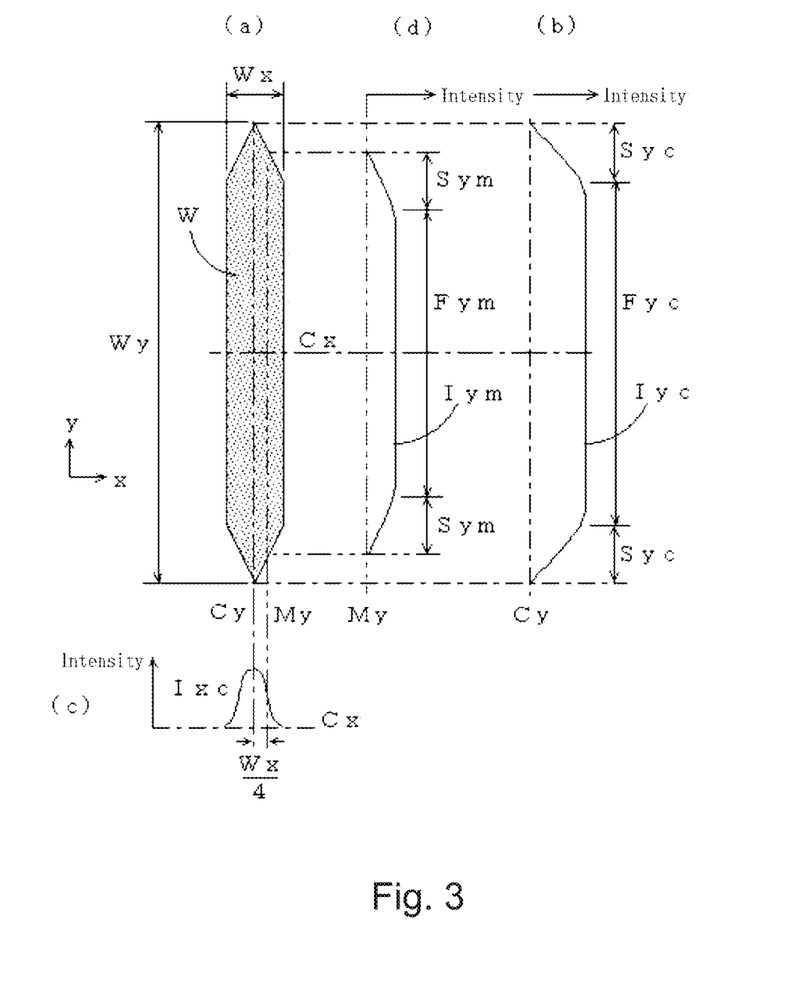
FIG. 3 describes a linear laser spot and the profile thereof.

FIG. 3 shows an example of the laser spot W.

As shown in FIG. 3(a), let Wy be the length of the laser spot W and Wx be the width thereof. Wy is, for example, 8 mm, and Wx is, for example, 0.06 mm. FIG. 3 is drawn in an exaggerated manner in the width direction for ease of illustration.

Let Cy be the major axis of the laser spot W and Cx be the minor axis thereof. Further, an axis extending in the y direction and separate from the major axis Cy by Wx/4 in the x direction is called an intermediate axis My.

As shown in FIG. 3(b), along the major axis Cy, the laser spot W has a profile Iyc, which has a flat portion Fyc, where the laser intensity can be considered to be uniform, and peripheral portions Syc, where the laser intensity gradually decreases.

As shown in FIG. 3(c), along the minor axis Cx, the laser spot W has a profile Ixc, which has a roughly Gaussian distribution.

As shown in FIG. 3(d), along the intermediate axis My, the laser spot W has a profile Iym, which has a flat portion Fym, where the laser intensity can be considered to be uniform, and peripheral portions Sym, where the laser intensity gradually decreases.

The profile Iym along the intermediate axis My differs from the profile Iyc along the major axis Cy in that the laser intensity is halved and the length in the y direction is shortened.

Figure 9:
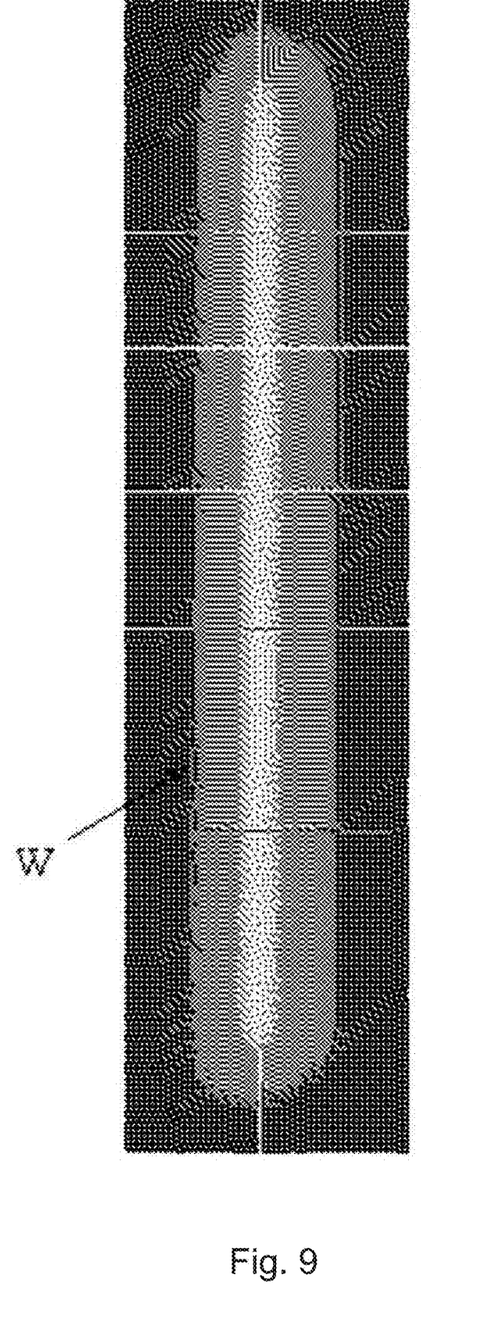
FIG. 9 is a descriptive diagram showing an actual shape of a laser spot.

FIG. 3 shows a shape set for convenience of description, and an actual shape of the laser spot W is a deformed shape in many cases, such as that in FIG. 9, as compared with the shape in FIG. 3. Even the actual shape has properties similar to those of the shape shown in FIG. 3, and the following description will therefore be made with reference to the shape in FIG. 3.

Figure 11:
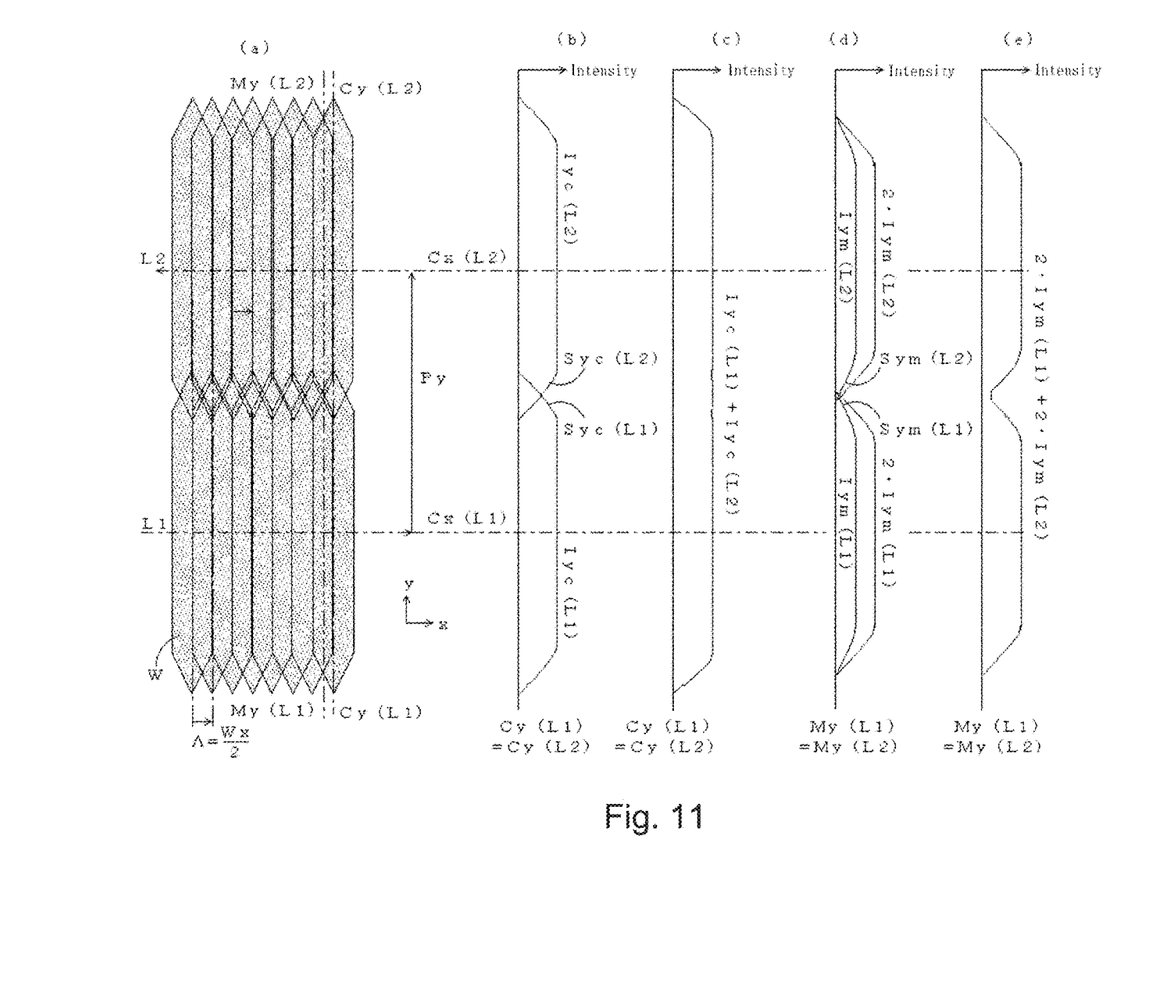
FIG. 11 is a descriptive diagram showing a laser irradiation method according to Comparative Example 1.

As shown in FIG. 11(a), laser irradiation is performed as follows: the laser spot W is moved in the +x direction along the line L1 and the laser spot W is applied in the form of pulses to a processing target object in irradiation positions arranged at width direction intervals Λ=Wx/2; the laser spot W is then moved in the y direction by the inter-scan-line distance Py; and the laser spot W is moved in the −x direction along the scan line L2 and the laser spot is applied in the form of pulses to the processing target object in irradiation positions arranged at the width direction intervals Λ=Wx/2.

In this process, it is assumed that the major axis Cy (L1) of the laser spot W in each of the irradiation positions on the line L1 coincides with the major axis Cy (L2) of the laser spot W in the corresponding irradiation position on the line L2, as in the case of the laser lift-off apparatus of related art described above.

Further, as shown in FIG. 11(b), the inter-scan-line distance Py is set to be Wy−Syc/2 so that the peripheral portion Syc (L1) of the profile Iyc (L1) along the major axis Cy (L1) in each of the irradiation positions on the line L1 half overlaps with the peripheral portion Syc (L2) of the profile Iyc (L2) along the major axis Cy (L2) in the corresponding irradiation position on the line L2.

As a result, a profile Iyc(L1)+Iyc(L2), which is the combination of the profiles along the major axis Cy (L1) and the major axis Cy (L2), has a roughly flat shape, as shown in FIG. 11(c).

However, the peripheral portion Sym (L1) of the profile Iym (L1) along the intermediate axis My (L1) in each of the irradiation positions on the line L1 hardly overlaps with the peripheral portion Sym (L2) of the profile Iym (L2) along the intermediate axis My (L2) in the corresponding irradiation position on the line L2, as shown in FIG. 11(d). It is noted that since the laser intensities in two irradiation positions adjacent to each other in the x direction are combined with each other on the intermediate axis My, the actual laser intensity is doubled or 2·Iym(L1) and 2·Iym (L2).

The combined profile 2·Iym(L1)+2·Iym(L2) on the intermediate axis My (L1) and the intermediate axis My (L2) therefore does not have a flat shape, as shown in FIG. 11(e), undesirably producing an insufficient intensity portion.

Figure 12:
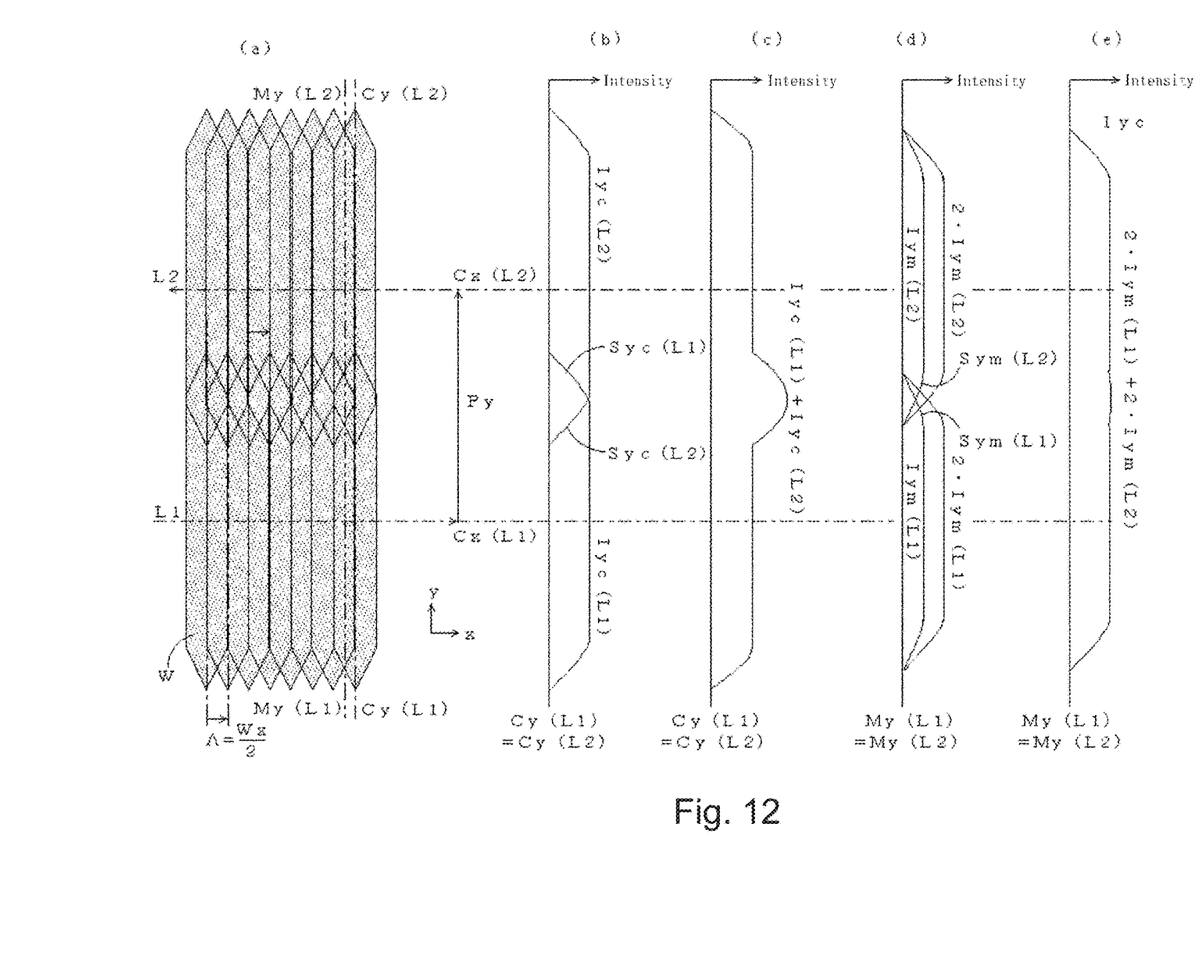
FIG. 12 is a descriptive diagram showing a laser irradiation method according to Comparative Example 2.

FIG. 12 is similar to FIG. 11 but differs therefrom in that the inter-scan-line distance Py is set to be Wy−Syc so that the peripheral portion Sym (L1) of the profile Iym (L1) along the intermediate axis My (L1) in each of the irradiation positions on the line L1 half overlaps with the peripheral portion Sym (L2) of the profile Iym (L2) along the intermediate axis My (L2) in the corresponding irradiation position on the line L2, as shown in FIG. 12(d).

As a result, a profile 2·Iym(L1)+2·Iym(L2), which is the combination of the profiles along the intermediate axis My (L1) and the intermediate axis My (L2), has a roughly flat shape, as shown in FIG. 12(e).

However, the peripheral portion Syc (L1) of the profile Iyc (L1) along the major axis Cy (L1) in each of the irradiation positions on the line L1 roughly entirely overlaps with the peripheral portion Syc (L2) of the profile Iyc (L2) along the major axis Cy (L2) in the corresponding irradiation position on the line L2, as shown in FIG. 12(b).

As a result, a profile Iyc(L1)+Iyc(L2), which is the combination of the profiles along the major axis Cy (L1) and the major axis Cy (L2), does not have a flat shape, undesirably producing an excessive intensity portion, as shown in FIG. 12(c).

In view of the problems described above, an object of the present invention is to provide a laser irradiation method and apparatus capable of laser irradiation using a linear laser spot with no insufficient intensity portion or excessive intensity portion.

Solution to Problem

In a first viewpoint, the present invention provides a laser irradiation method that sets a plurality of scan lines (L1, L2, L3, . . . ) extending in an x direction in parallel to one another and arranged in a y direction so as to be separate from one another by an inter-scan-line distance Py in correspondence with laser irradiation areas of a processing target object (B), orients a length direction of a linear laser spot (W) having a length Wy and a width Wx in the y direction, and irradiates the processing target object (B) with the laser spot (W) in each of irradiation positions arranged at width direction intervals Λ while moving the laser spot (W) relative to the processing target object (B) along the scan lines, characterized in that the method comprises determining the inter-scan-line distance Py, the width direction interval Λ, and a position shift quantity Δx (where, 0<Δx<Λ) in such a way that the irradiation positions on adjacent scan lines are shifted from each other in the x direction by the position shift quantity Δx and a cumulative value of the applied laser intensity is substantially equalized.

In the laser irradiation method shown in FIGS. 11 and 12, in which the irradiation positions on the adjacent scan lines L1 and L2 coincide with each other in the x direction, the amount of overlap between the profile Iyc (L1) and the profile Iyc (L2) along the major axis Cy (L1) and the major axis Cy (L2) greatly differs from the amount of overlap between the profile Iym (L1) and the profile Iym (L2) along the intermediate axis My, undesirably causing one of the amounts of overlap to be adequate but the other amount of overlap to be inadequate.

In contrast, in the laser irradiation method according to the first viewpoint described above, in which the irradiation positions on the adjacent scan lines L1 and L2 are shifted from each other in the x direction by the position shift quantity Δx (where, 0<Δx<Λ), the amounts of overlap can be made to not differ from each other by adjusting the position shift quantity Δx in accordance with the profile of the laser spot (W). Laser irradiation using the linear laser spot can therefore be performed with no insufficient intensity portion or excessive intensity portion also by adjusting the inter-scan-line distance Py and the width direction interval Λ in such a way that the cumulative value of the applied laser intensity is substantially equalized.

In a second viewpoint, the present invention provides a laser irradiation method characterized in that in the laser irradiation method according to the first viewpoint described above, in a case where an angle θ between the length direction of the linear laser spot (W) and the y direction is not negligible, the position shift quantity Δx is corrected in accordance with the angle θ.

In the laser irradiation method according to the second viewpoint described above, even when the length direction of the linear laser spot (W) does not completely coincide with the y direction, the position shift quantity Δx can be set such that no difference in the amount of overlap is produced.

In a third viewpoint, the present invention provides a laser irradiation method characterized in that in the laser irradiation method according to the first or second viewpoint described above, in a case where the laser spot moves in relatively opposite directions along scan lines adjacent to each other and a delay period τ that elapses from a timing when a laser oscillation instruction signal is issued until laser beam emission actually starts is not negligible, the position shift quantity Δx is corrected in accordance with the delay period τ.

In the laser irradiation method according to the third viewpoint described above, even when the delay period τ is not negligible, the position shift quantity Δx can be set such that no difference in the amount of overlap is produced.

In a fourth viewpoint, the present invention provides a laser irradiation apparatus characterized in that the laser irradiation apparatus includes a laser irradiation unit that emits a laser spot (W) having a linear shape having a length Wy and a width Wx in the form of pulses, processing a target object movement unit capable of moving a processing target object (B) placed on the processing target object movement unit in an x direction and a y direction, and a a controller that sets a plurality of scan lines (L1, L2, L3, . . . ) extending in the x direction in parallel to one another and arranged in the y direction so as to be separate from one another by an inter-scan-line distance Py in correspondence with laser irradiation areas of the processing target object (B), orienting a length direction of the laser spot (W) in the y direction, moving the processing target object (B) in the x direction in such a way that the processing target object (B) is irradiated with the laser spot in each of irradiation positions arranged at width direction intervals Λ on the scan lines, and shifting the irradiation positions on adjacent scan lines in the x direction by a position shift quantity Δx, and the inter-scan-line distance Py, the width direction interval Λ, and the position shift quantity Δx (where, 0<Δx<Λ) are determined so that a cumulative value of the applied laser intensity is substantially equalized.

In the laser irradiation apparatus according to the fourth viewpoint described above, the laser irradiation method according to the first viewpoint described above can be preferably carried out.

In a fifth viewpoint, the present invention provides a laser irradiation apparatus characterized in that in the laser irradiation apparatus according to the fourth viewpoint described above, in a case where an angle θ between the length direction of the linear laser spot (W) and the y direction is not negligible, the controller corrects the position shift quantity Δx in accordance with the angle θ.

In the laser irradiation apparatus according to the fifth viewpoint described above, the laser irradiation method according to the second viewpoint described above can be preferably carried out.

In a sixth viewpoint, the present invention provides a laser irradiation apparatus characterized in that in the laser irradiation apparatus according to the fourth or fifth viewpoint described above, in a case where the laser spot moves in relatively opposite directions along scan lines adjacent to each other and a delay period τ that elapses from a timing when a laser oscillation instruction signal is issued until laser beam emission actually starts is not negligible, the controller corrects the position shift quantity Δx in accordance with the delay period τ.

In the laser irradiation apparatus according to the sixth viewpoint described above, the laser irradiation method according to the third viewpoint described above can be preferably carried out.

Advantageous Effect of Invention

The laser irradiation method and apparatus according to the present invention allow laser irradiation using a linear laser spot with no insufficient intensity portion or excessive intensity portion.

DESCRIPTION OF EMBODIMENTS

The present invention will be described below in more detail with reference to embodiments shown in the drawings. It is not intended that the embodiments limit the scope of the present invention.

Figure 1:
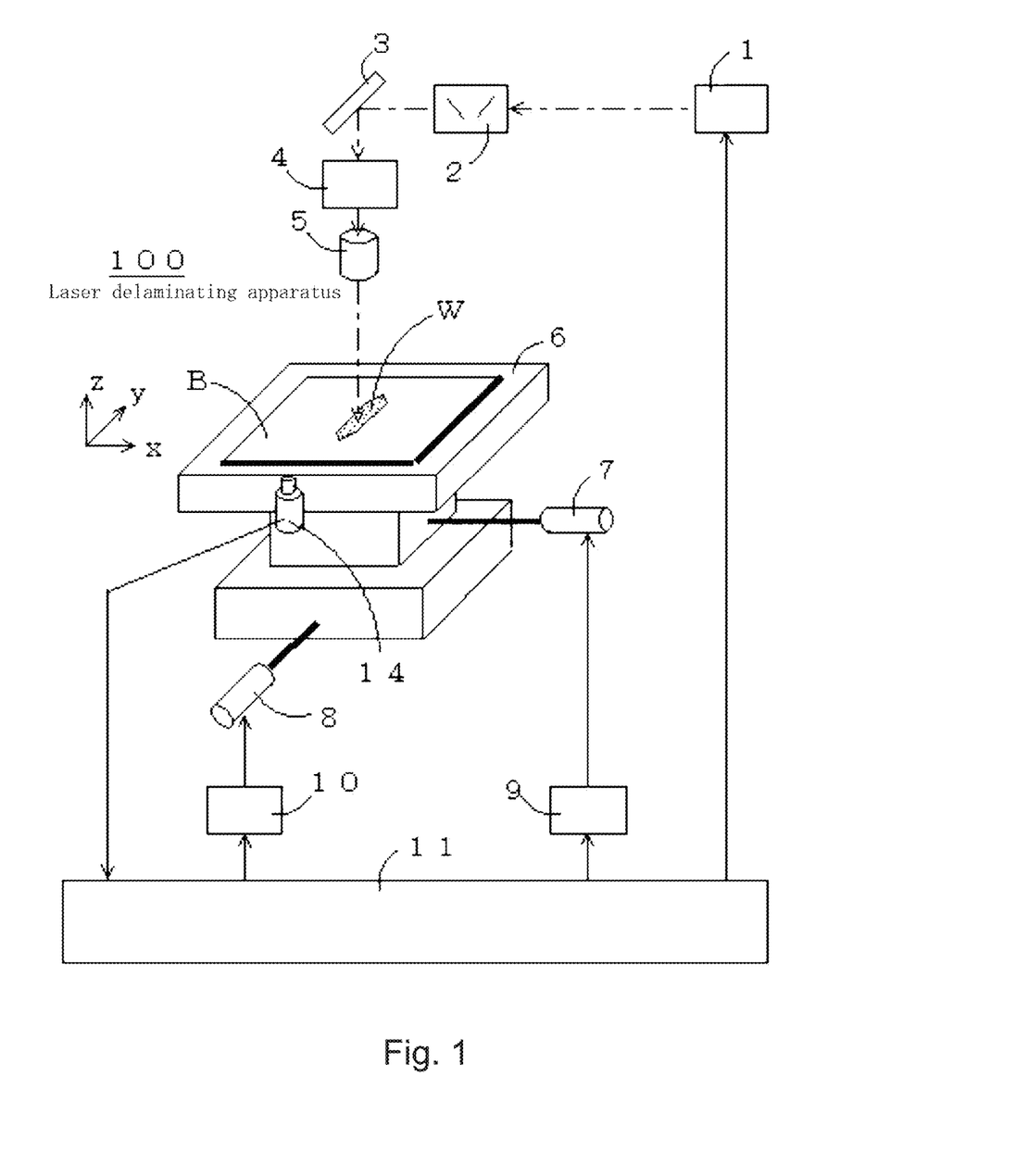
FIG. 1 is a configuration descriptive diagram showing a laser delamination apparatus according to Example 1.

FIG. 1 is a configuration descriptive diagram showing a laser delamination apparatus according to Example 1.

FIG. 2 describes scan lines.

FIG. 3 describes a linear laser spot and the profile thereof.

Figure 4:
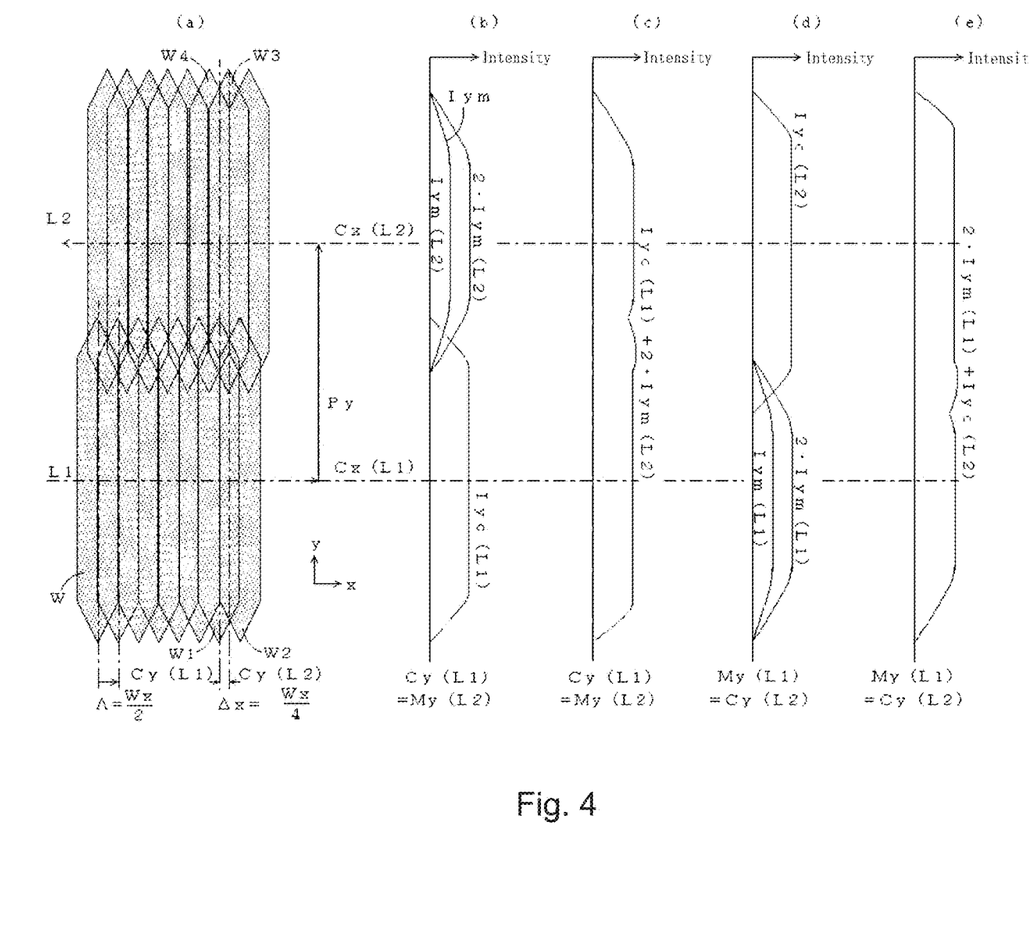
FIG. 4 is a descriptive diagram showing a laser irradiation method according to Example 1.

FIG. 4 is a descriptive diagram showing a laser irradiation method according to Example 1.

Figure 5:
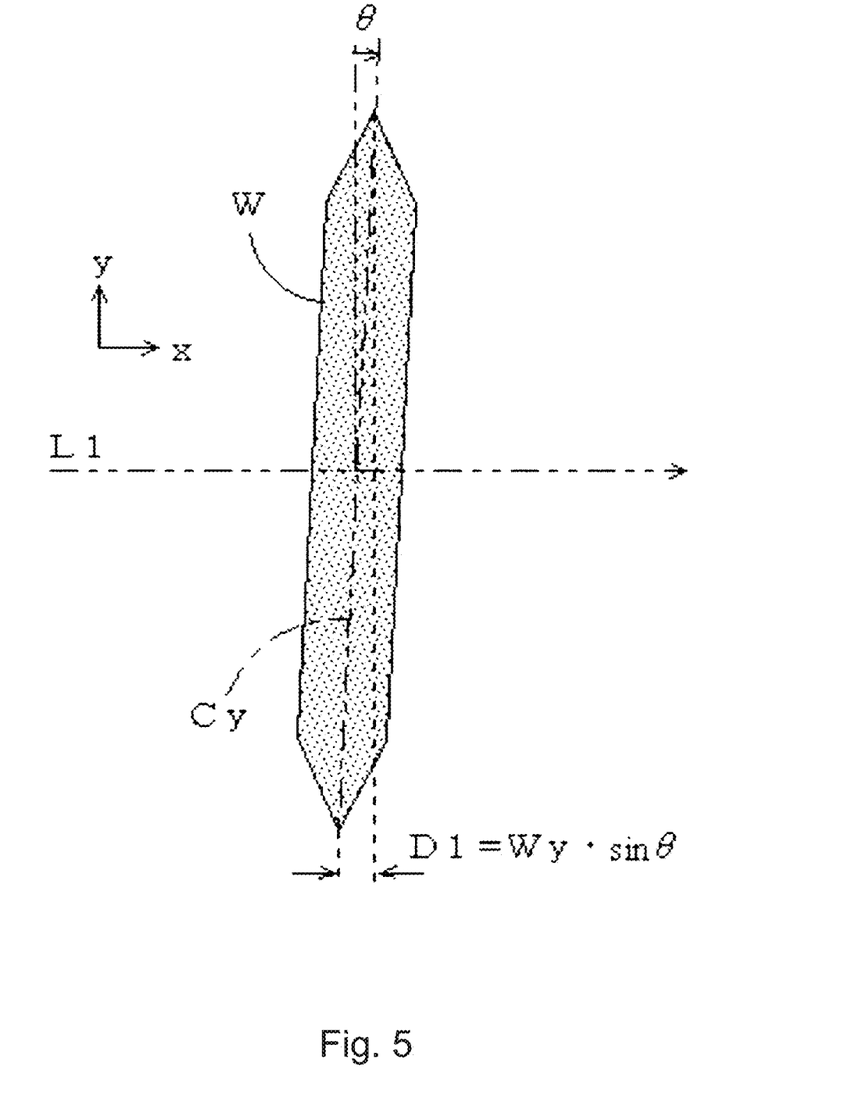
FIG. 5 describes an angle θ between the length direction of the linear laser spot and the y direction.

FIG. 5 describes an angle θ between the length direction of the linear laser spot and the y direction.

Figure 6:
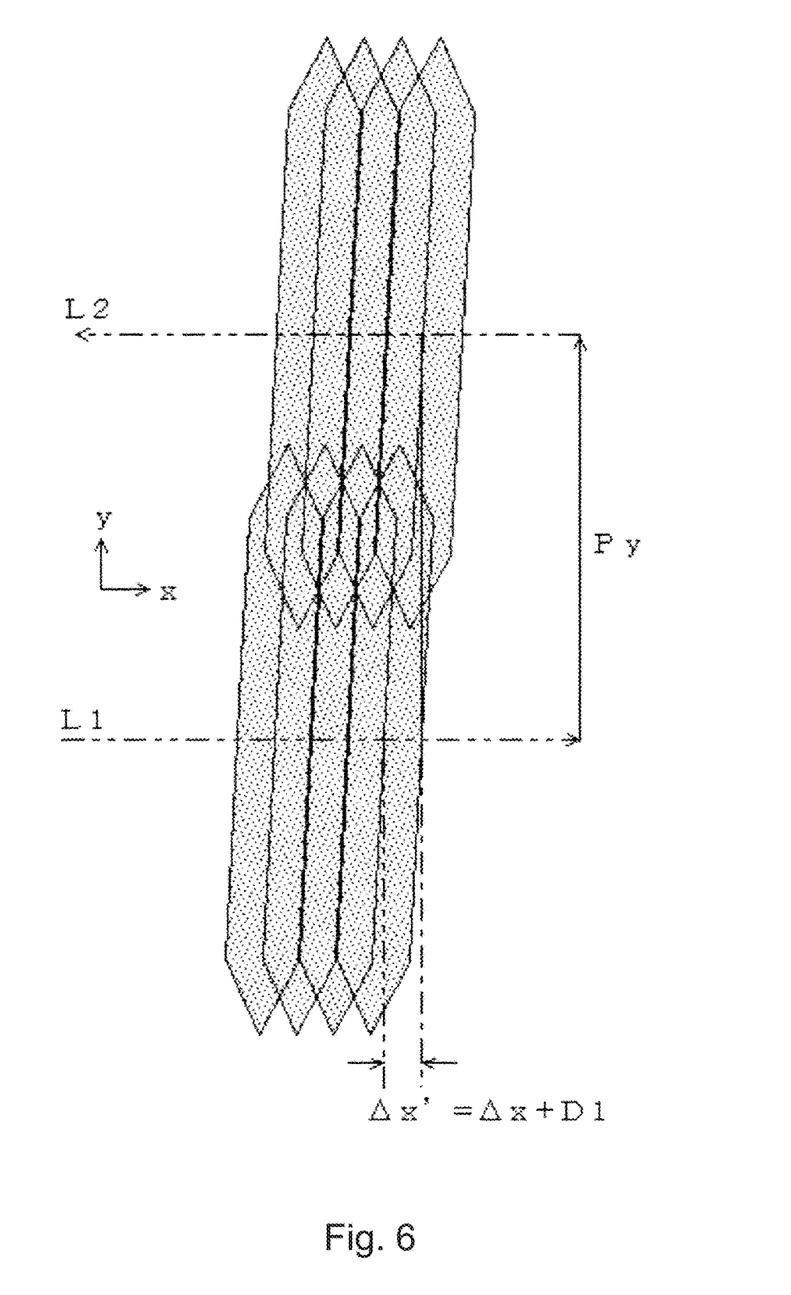
FIG. 6 is a descriptive diagram showing a correction method according to the angle θ between the length direction of the linear laser spot and the y direction.

FIG. 6 is a descriptive diagram showing a correction method according to the angle θ between the length direction of the linear laser spot and the y direction.

Figure 7:
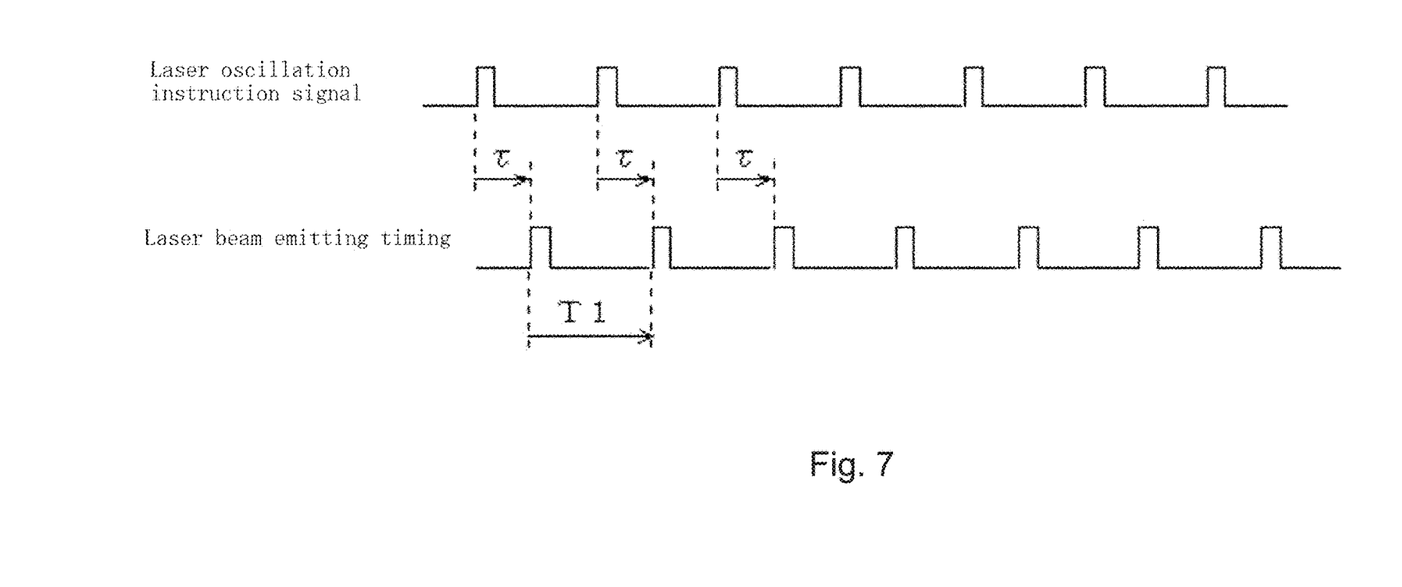
FIG. 7 describes a delay period τ that elapses from the timing when an irradiation trigger signal is issued until irradiation is performed.

FIG. 7 describes a delay period τ that elapses from the timing when an irradiation trigger signal is issued until irradiation is performed.

Figure 8:
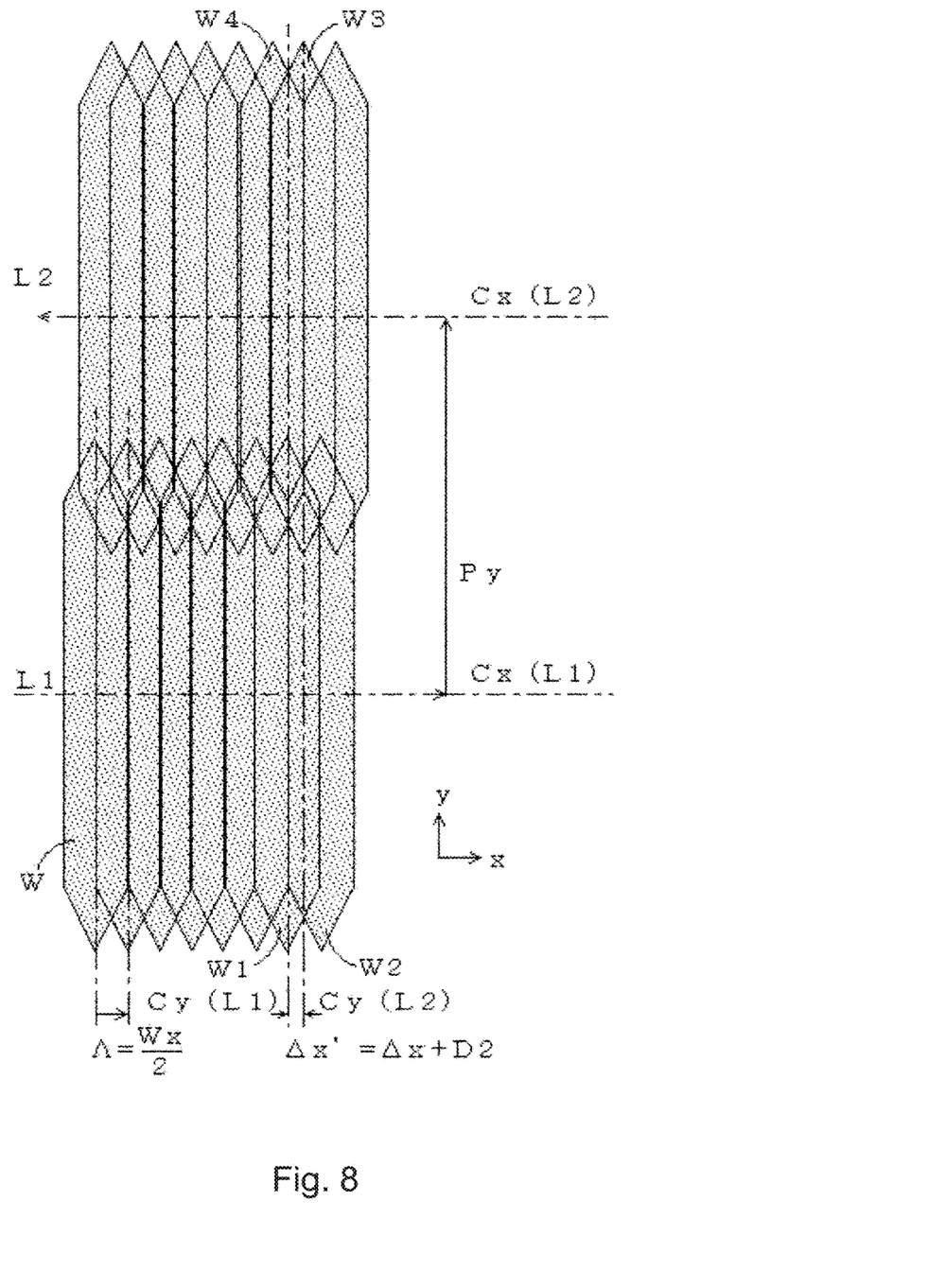
FIG. 8 is a descriptive diagram showing a correction method according to the delay period τ that elapses from the timing when the irradiation trigger signal is issued until irradiation is performed.

FIG. 8 is a descriptive diagram showing a correction method according to the delay period τ that elapses from the timing when the irradiation trigger signal is issued until irradiation is performed.

FIG. 9 is a descriptive diagram showing an actual shape of a laser spot.

Figure 10:
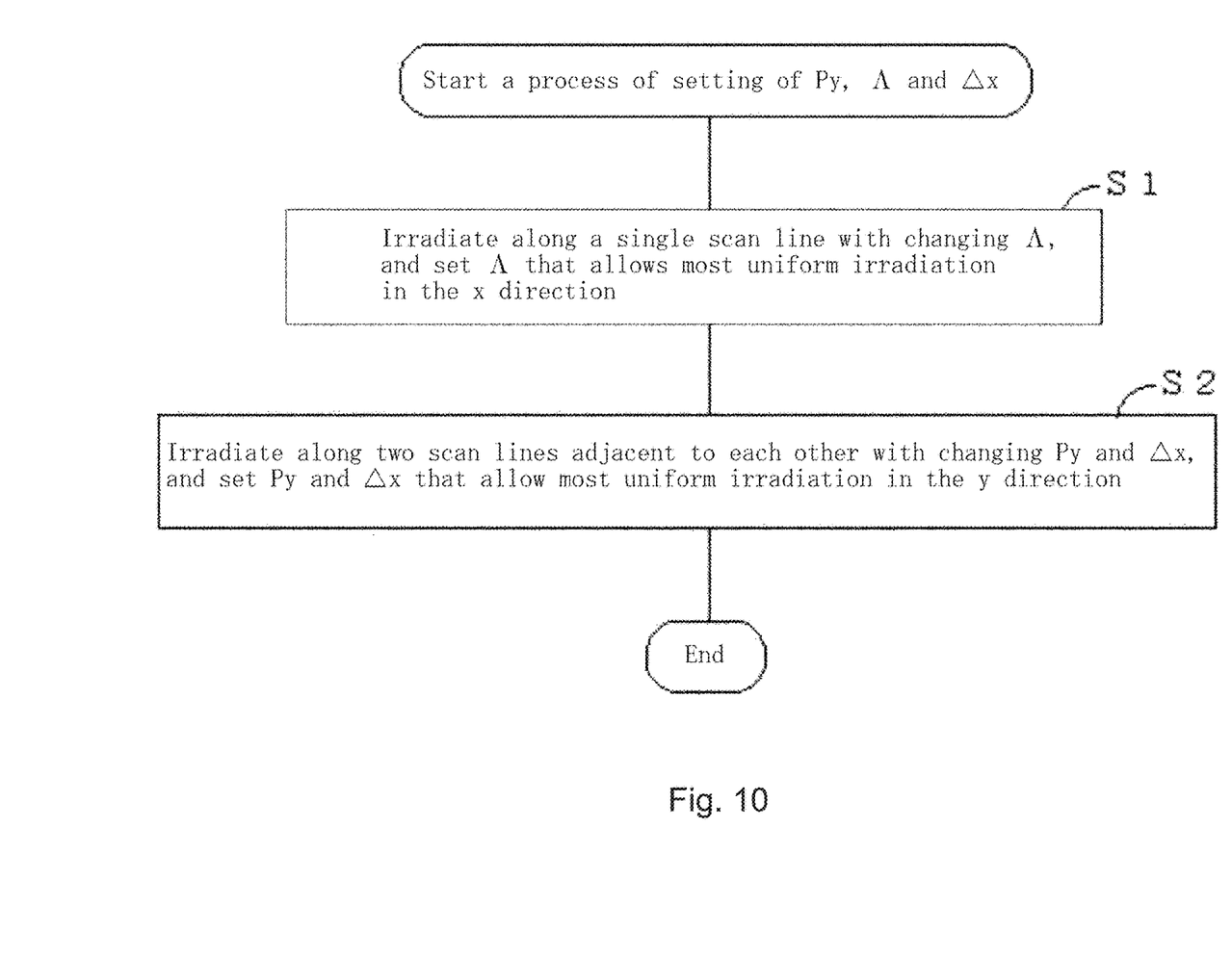
FIG. 10 is a flowchart showing the process of determining an inter-scan-line distance Py, a width direction interval Λ, and a position shift amount Δx.

FIG. 10 is a flowchart showing the process of determining an inter-scan-line distance Py, a width direction interval Λ, and a position shift amount Δx.

FIG. 11 is a descriptive diagram showing a laser irradiation method according to Comparative Example 1.

FIG. 12 is a descriptive diagram showing a laser irradiation method according to Comparative Example 2.

EXAMPLES

Example 1

FIG. 1 is a configuration descriptive diagram showing a laser delamination apparatus 100 according to Example 1.

The laser delamination apparatus 100 includes a laser irradiation unit 1, which outputs a laser beam having an ultraviolet wavelength in the form of pulses, an attenuator 2, a mirror 3, a beam shaper 4, which shapes the laser beam into a linear laser spot W, a lens system 5, a stage 6, on which a processing target object B is placed and which moves the processing target object B in the x direction and the y direction, an x-direction movement motor 7, a y-direction movement motor 8, an x-direction movement driver 9, a y-direction movement driver 10, and a system controller 11, which controls the laser irradiation unit 1, controls the x-direction movement motor 7, controls the y-direction movement motor 8, and performs other types of control.

The processing target object B is, for example, a glass carrier which has a thickness ranging from 500 μm to 1000 μm and on which a plastic substrate (polyimide film substrate, for example) having a thickness of several tens of micrometers is laminated. The plastic substrate has, for example, an organic EL element and terminals formed therein.

The processing target object B is placed on the stage 6 with the glass carrier facing the laser irradiation side.

The processing target object B is irradiated with the laser spot via the glass carrier to be locally heated, whereby the plastic substrate is delaminated from the glass carrier.

The laser irradiation unit 1 is, for example, an LD-pumped laser made of Nd:YAG as the lasing medium.

The output intensity of the laser irradiation unit 1 is, for example, 50 W, and the attenuator 2 is adjusted so that the processing target object B is irradiated with a laser spot having, for example, 10 W.

The wavelength of the laser beam is, for example, 355 nm that is a result of wavelength conversion of 1064 nm.

A cycle T1 at which the laser beam is outputted in the form of pulses is, for example, 1/6000 seconds.

The length direction of the linear laser spot W is oriented in the y direction, and the stage 6 moves the processing target object B in the −x direction at a speed V to scan the processing target object B in the +x direction along the scan line L1, as shown in FIG. 2. The speed V is, for example, 180 mm/second.

The stage 6 then moves the processing target object B in the −y direction by the inter-scan-line distance Py.

The stage 6 then moves the processing target object B in the +x direction at the speed V to scan the processing target object B with the laser spot W in the −x direction along the scan line L2.

The stage 6 then moves the processing target object B in the −y direction by the inter-scan-line distance Py.

The stage 6 then moves the processing target object B in the −x direction at the speed V to scan the processing target object B with the laser spot W in the +x direction along the scan line L3.

The stage 6 then moves the processing target object B in the −y direction by the inter-scan-line distance Py.

The stage 6 then moves the processing target object B in the +x direction at the speed V to scan the processing target object B with the laser spot W in the −x direction along the scan line L4.

The stage 6 then moves the processing target object B in the −y direction by the inter-scan-line distance Py.

The stage 6 then moves the processing target object B in the −x direction at the speed V to scan the processing target object B with the laser spot W in the +x direction along the scan line L5.

When the processing target object B is scanned with the laser spot W along the scan line L3, laser irradiation in which the processing target object B is irradiated with the laser spot W in the form of pulses is repeated.

Even in the period other than the laser irradiation performed on the processing target object B, the laser irradiation unit 1 repeats emission of the laser beam in the form of pulses to maintain the intensity of the laser beam constant.

Let Wy be the length of the laser spot W and Wx be the width thereof, as shown in FIG. 3(*a*). Wy is, for example, 8 mm, and Wx is, for example, 0.06 mm. FIG. 3 is drawn in an exaggerated manner in the width direction for ease of illustration.

Let Cy be the major axis of the laser spot W and Cx be the minor axis thereof. Further, the axis extending in the y direction and separate from the major axis Cy by Wx/4 in the x direction is called the intermediate axis My.

As shown in FIG. 3(*b*), along the major axis Cy, the laser spot W has the profile Iyc, which has the flat portion Fyc, where the laser intensity can be considered to be uniform, and the peripheral portions Syc, where the laser intensity gradually decreases.

As shown in FIG. 3(*c*), along the minor axis Cx, the laser spot W has the profile Ixc, which has a roughly Gaussian distribution.

As shown in FIG. 3(*d*), along the intermediate axis My, the laser spot W has the profile Iym, which has the flat portion Fym, where the laser intensity can be considered to be uniform, and the peripheral portions Sym, where the laser intensity gradually decreases.

The profile Iym along the intermediate axis My differs from the profile Iyc along the major axis Cy in that the laser intensity is halved and the length in the y direction is shortened.

To scan the processing target object B with the laser spot W in the +x direction along the scan line L1, the processing target object B is irradiated with the laser spot W in the form of pulses in irradiation positions arranged at width direction intervals Λ=Wx/2, as shown in FIG. 4(*a*). When Wx=0.06 mm, Λ=0.03 mm. Λ is also equal to V×T1. That is, when V=180 mm/second and T1=1/6000 seconds, Λ=180 mm/6000=0.03 mm. The system controller 11 stores the irradiation positions where the processing target object B has been irradiated with the laser spot W along the scan line L1.

Thereafter, to scan the processing target object B with the laser spot W in the −x direction along the scan line L2, the processing target object B is also irradiated with the laser spot W in the form of pulses in irradiation positions arranged at the width direction intervals Λ=Wx/2. The system controller 11, however, shifts the stored irradiation positions along the scan line L1 by a position shift quantity Δx=Wx/4 in the x direction and sets the shifted positions as the irradiation positions along the scan line L2.

That is, the major axis Cy (L1) in each of the irradiation positions on the scan line L1 and the major axis Cy (L2) in the corresponding irradiation position on the scan line L2 are shifted from each other by Δx=Wx/4. As a result, the major axis Cy (L1) in each of the irradiation positions on the line L1 coincides with the intermediate axis My (L2) in the corresponding irradiation positions on the line L2. Further, the intermediate axis My (L1) in each of the irradiation positions on the line L1 coincides with the major axis Cy (L2) in the corresponding irradiation position on the line L2.

To scan the processing target object B with the laser spot W in the +x direction along odd-numbered scan lines (L3, L5), the scanning is performed in the same manner in which the processing target object B is scanned with the laser spot W in the +x direction along the scan line L1.

To scan the processing target object B with the laser spot W in the +x direction along an even-numbered scan line (L4), the scanning is performed in the same manner in which the processing target object B is scanned with the laser spot W in the +x direction along the scan line L2.

Since the laser irradiation unit 1 repeats emission of the laser beam in the form of pulses in the cycle T1, the system controller 11 controls the timing of movement of the stage 6 on the basis of the laser beam emission timing to control the irradiation positions.

The inter-scan-line distance Py is adjusted so that the peripheral portion Syc (L1) of the profile Iyc (L1) along the major axis Cy (L1) in each of the irradiation positions on the scan line L1 half overlaps with the peripheral portion Sym (L2) of the profile Iym (L2) along the intermediate axis My (L2) in the corresponding irradiation position on the scan line L2, as shown in FIG. 4(b). For example, fine adjustment only needs to be made on the inter-scan-line distance Py with reference to Py=Wy−(Syc+Sym)/2. It is noted that since the laser intensities in two irradiation positions adjacent to each other in the x direction are combined with each other on the intermediate axis My, the actual laser intensity is doubled or 2·Iym(L2).

The combined profile Iyc(L1)+2·Iym(L2) on the major axis Cy (L1) and the intermediate axis My (L2) therefore has a roughly flat shape, as shown in FIG. 4(c).

With the inter-scan-line distance Py adjusted as shown in FIG. 4(b), the peripheral portion Sym (L1) of the profile Iym (L1) along the intermediate axis My (L1) in each of the irradiation position on the scan line L1 half overlaps with the peripheral portion Syc (L2) of the profile Iyc (L2) along the major axis Cy (L2) in the corresponding irradiation position on the scan line L2, as shown in FIG. 4(d). Since the laser intensities in two irradiation positions adjacent to each other in the x direction are combined with each other on the intermediate axis My, the actual laser intensity is doubled or 2·Iym(L1).

The combined profile 2·Iym(L1)+Iyc(L2) on the intermediate axis My (L1) and the major axis Cy (L2) therefore also has a roughly flat shape, as shown in FIG. 4(e).

The positional relationship between the irradiation positions on odd-numbered scan lines and the irradiation positions on even-numbered scan lines is the same as the positional relationship between the irradiation positions on the first scan line L1 and the irradiation positions on the second scan line L2.

According to the laser delamination apparatus 100 of Example 1, since the inter-scan-line distance Py, the width direction interval Λ, and the position shift quantity Δx are determined so that the cumulative value of the applied laser intensity is substantially equalized, the processing target object B can be irradiated with the linear laser spot W to be locally heated with no insufficient intensity portion or excessive intensity portion. The plastic substrate can therefore be preferably delaminated from the glass carrier with no damage of the plastic substrate or parts attached thereto.

Example 2

It is assumed that the length direction of the laser spot W and the y direction forms an angle θ, and that the angle θ is not negligible, as shown in FIG. 5.

The system controller 11 corrects the position shift quantity Δx in accordance with the angle θ, as shown in FIG. 6. Let Δx be the position shift quantity in a case where the angle θ can be considered to be zero and D1 be the amount of correction, and a corrected position shift quantity Δx' for the adjacent scan line is Δx+D1.

In a case where the conditions are the same as those in Example 1 except that the angle θ cannot be considered to be zero, Δx=Wx/4 and D1=Wy·sin θ.

The angle θ depends on adjustment of the mirror 3 and the beam shaper 4 and is fixed after the mirror 3 and the beam shaper 4 are adjusted.

According to the laser delamination apparatus of Example 2, even when the angle θ is not negligible, the major axis Cy in each of the irradiation positions on an odd-numbered scan line coincides with the intermediate axis My in the corresponding irradiation position on an even-numbered scan line, and the intermediate axis My in each of the irradiation positions on an odd-numbered scan line coincides with the major axis Cy in the corresponding irradiation position on an even-numbered scan line.

Example 3

It is assumed that after the system controller 11 issues a laser oscillation instruction signal to the laser irradiation unit 1, there is a delay period τ until the laser irradiation unit 1 actually starts emitting the laser beam, as shown in FIG. 7, and the delay period τ is not negligible.

The system controller 11 corrects the position shift quantity Δx in accordance with the delay period τ, as shown in FIG. 8. Let Δx be the position shift quantity in a case where the delay period τ can be considered to be zero and D2 be the amount of correction, and a corrected position shift quantity Δx' for the adjacent scan line is Δx+D2.

In a case where the conditions are the same as those in Example 1 except that the delay period τ cannot be considered to be zero, Δx=Wx/4 and D2=2·V·τ.

According to the laser delamination apparatus of Example 3, even when the delay period τ is not negligible, the major axis Cy in each of the irradiation positions on an odd-numbered scan line coincides with the intermediate axis My in the corresponding irradiation position on an even-numbered scan line, and the intermediate axis My in each of the irradiation positions on an odd-numbered scan line coincides with the major axis Cy in the corresponding irradiation position on an even-numbered scan line.

Example 4

In a case where both of the angle θ and the delay period τ is not negligible, the system controller 11 corrects the position shift quantity Δx in accordance with the angle θ and the delay period τ. Let Δx be the position shift quantity in a case where the angle θ and the delay period τ can each be considered to be zero, D1 be the amount of correction according to the angle θ, and D2 be the amount of correction according to the delay period τ, and a corrected position shift quantity Δx' for the adjacent scan line is Δx+D1+D2.

In a case where the conditions are the same as those in Example 1 except that the angle θ and the delay period τ cannot each be considered to be zero, Δx=Wx/4, D1=Wy·sin θ, and D2=2·V·τ.

According to the laser delamination apparatus of Example 4, even when both of the angle θ and the delay period τ is not negligible, the major axis Cy in each of the irradiation positions on an odd-numbered scan line coincides with the intermediate axis My in the corresponding irradiation position on an even-numbered scan line, and the intermediate axis My in each of the irradiation position on an odd-numbered scan line coincides with the major axis Cy in the corresponding irradiation position on an even-numbered scan line.

Example 5

An actual shape of the laser spot W is a deformed shape in many cases, such as that in FIG. 9, as compared with the shape in FIG. 3. In view of the fact described above, the inter-scan-line distance Py, the width direction interval Λ, and the position shift quantity Δx are in practice determined by a cut-and-try approach in each laser delamination apparatus.

FIG. 10 is a flowchart showing the process of setting the inter-scan-line distance Py, the width direction interval Λ, and the position shift quantity Δx.

In step S1, the processing target object B is placed in the laser delamination apparatus and irradiated along a single scan line at certain width direction intervals Λ repeatedly with the width direction interval Λ changed to search for a width direction interval Λ that allows most uniform irradiation in the x direction, and the resultant width direction interval Λ is set. In step S2, the processing target object B is irradiated along two scan lines adjacent to each other and separate from each other by a certain inter-scan-line distance Py and a position shift quantity Δx repeatedly with the inter-scan-line distance Py and the position shift quantity Δx changed to search for an inter-scan-line distance Py and a position shift quantity Δx that allow most uniform irradiation in the y direction, and the resultant inter-scan-line distance Py and position shift quantity Δx are set.

The process is then terminated.

According to Example 5, an optimum inter-scan-line distance Py, width direction interval Λ, and position shift quantity Δx can be set in each laser delamination apparatus.

INDUSTRIAL APPLICABILITY

The laser irradiation method and apparatus according to the present invention can be used, for example, to carry out the process of delaminating a plastic substrate formed on a glass carrier.

REFERENCE SIGNS LIST

1 Laser irradiation unit
2 Attenuator
3 Mirror
4 Beam shaper
5 Lens system
6 Stage
7 X-direction movement motor
8 Y-direction movement motor
9 X-direction movement driver
10 Y-direction movement driver
11 System controller
100 Laser delamination apparatus
B Processing target object
W Laser spot

The invention claimed is:

1. A laser irradiation method that sets a plurality of scan lines extending in an x direction in parallel to one another and arranged in a y direction so as to be separate from one another by an inter-scan-line distance Py in correspondence with laser irradiation areas of a processing target object, orients a length direction of a linear laser spot having a length Wy and a width Wx in the y direction, and irradiates the processing target object with the laser spot in each of irradiation positions arranged at a width direction interval Λ while moving the laser generating the laser spot relative to the processing target object along the x direction such that the laser spot moves relative to the processing target object along the scan lines, the laser irradiation method comprising:

determining the inter-scan-line distance Py, the width direction interval Λ, and a position shift quantity Δx (where 0<Δx<Λ) such that the irradiation positions on adjacent scan lines are shifted from each other in the x direction by the position shift quantity Δx and a cumulative value of the applied laser intensity is substantially equalized, in accordance with a profile of the laser spot.

2. The laser irradiation method according to claim 1, wherein in a case where an angle θ between the length direction of the linear laser spot and the y direction is not negligible, the position shift quantity Δx is corrected in accordance with the angle θ.

3. The laser irradiation method according to claim 1, wherein in a case where the laser spot moves in relatively opposite directions along scan lines adjacent to each other and a delay period τ that elapses from a timing when a laser oscillation instruction signal is issued until laser beam emission actually starts is not negligible, the position shift quantity Δx is corrected in accordance with the delay period τ.

* * * * *